United States Patent
Cai

(10) Patent No.: US 9,653,491 B1
(45) Date of Patent: May 16, 2017

(54) ARRAY SUBSTRATE AND MANUFACTURING METHOD, DISPLAY PANEL AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD, Hefei, Anhui (CN)

(72) Inventor: Zhenfei Cai, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/214,343

(22) Filed: Jul. 19, 2016

(30) Foreign Application Priority Data

Mar. 25, 2016 (CN) .......................... 2016 1 0180017

(51) Int. Cl.
H01L 23/52 (2006.01)
H01L 21/336 (2006.01)
H01L 27/12 (2006.01)
H01L 27/02 (2006.01)

(52) U.S. Cl.
CPC ...... H01L 27/1244 (2013.01); H01L 27/0251 (2013.01); *H01L 27/1259* (2013.01)

(58) Field of Classification Search
CPC ............... H01L 27/124; H01L 27/1244; H01L 27/0296; H01L 27/0251; H01L 27/1262
USPC ........................................... 257/776; 438/280
See application file for complete search history.

(56) References Cited

U.S. PATENT DOCUMENTS

| | | | | |
|---|---|---|---|---|
| 8,334,959 B2* | 12/2012 | Hirabayashi | ...... | G02F 1/136204 345/104 |
| 8,610,840 B2* | 12/2013 | Kwon | ................. | G02F 1/13452 349/192 |
| 8,670,102 B2* | 3/2014 | Cheng | ............... | G02F 1/136259 349/158 |

* cited by examiner

*Primary Examiner* — Luan C Thai
(74) *Attorney, Agent, or Firm* — Blakely Sokoloff Taylor & Zafman LLP

(57) ABSTRACT

An array substrate comprises a plurality of data lines and a plurality of gate lines arranged to intersect with each other, an annular common signal line surrounding the data lines and the gate lines, and at least one annular repair line. The repair line is electrically connected with the common signal line through an anti-static ring. The repair line comprises a first line segment and a second line segment insulated from each other. The first line segment intersects with and is insulated from each of the data lines, the second line segment does not intersect with the data lines and is electrically connected with the common signal line through the anti-static ring. A repair portion is arranged between the first line segment and the second line segment, which is used for enabling the first line segment to be electrically connected with the second line segment after being welded.

14 Claims, 4 Drawing Sheets

ARRAY SUBSTRATE AND MANUFACTURING METHOD, DISPLAY PANEL AND DISPLAY DEVICE

RELATED APPLICATION

The present application claims the benefit of Chinese Patent Application No. 201610180017.9, filed on Mar. 25, 2016, the entire disclosure of which is incorporated herein by reference.

FIELD OF THE INVENTION

The present invention relates to the field of display technology, particularly to an array substrate and a manufacturing method thereof, a display panel and a display device.

BACKGROUND

In the field of display, the display panel of a flat panel display device (e.g., a liquid crystal display device or a light emitting diode display device) comprises an array substrate and an opposite substrate. The array substrate has data lines and gate lines arranged to intersect with each other. The data lines and the gate lines constitute a plurality of display units. A common signal line is formed surrounding the data lines and the gate lines. The array substrate is further formed with a repair line for repairing open circuit or short circuit trouble of the data lines, the gate lines or other signal lines. For example, the array substrate as shown in FIG. 1 comprises a plurality of data lines 11, a plurality of gate lines 12, a common signal line 13 and a repair line 14. The common signal line 13 and the repair line 14 are annular signal lines, and the repair line 14 is electrically connected with the common signal line 13 through an anti-static ring 15. The repair line 14 intersects with and is insulated from the data lines 11. In detection after the cell-forming process, if a certain data line 11 encounters open circuit or short circuit trouble, the maintenance personnel can repair this open circuit or short circuit data line 11 using the repairing line 14. For instance, if open circuit occurs to a certain data line 11, laser welding can be performed to the overlapping positions of this data line 11 with the repairing line 14 respectively, in this way, the data signal will be transmitted through the repair line 14. Certainly, open circuit of one data line 11 can be repaired only using half of an annular repair line 14, the other half of the annular repair line 14 can be used to repair open circuit for another data line 11, thus each repair line 14 can resolve open circuit problem for two data lines 11.

However, for the above array substrate, electrostatic charges generated during the normal operation of the display panel or in the manufacturing process of the display panel may enter the interior of the display panel through the repair line 14. For example, when plasma of high temperature and high energy bombards the surface of the array substrate, the electrostatic charges may be generated and aggregated on the common signal line 13, or the electrostatic charges may be aggregated on the peripheral common signal line 13 in the process of high speed transmission of the array substrate. The common signal line 13 may apply an electrostatic effect on the repair line 14 through the anti-static ring 15, which results in damage of nodes and devices within the display panel. When the electrostatic charges are accumulated to a certain degree, it may even break down the devices within the display panel, which results in defects of the display panel, thereby reducing yield of the display panel.

SUMMARY

Embodiments of the invention provide an array substrate, a method for manufacturing an array substrate, a display panel and a display device, so as to mitigate or overcome the problem in the prior art that the display panel may be damaged after the electrostatic charges enters the display panel through the repair line so as to result in decrease of the yield of the display panel.

An embodiment of the invention provides an array substrate, which may comprise a plurality of data lines and a plurality of gate lines arranged to intersect with each other, an annular common signal line surrounding the data lines and the gate lines, and at least one annular repair line, the repair line being electrically connected with the common signal line through an anti-static ring. The repair line comprises a first line segment and a second line segment insulated from each other. The first line segment intersects with and is insulated from each of the data lines, the second line segment does not intersect with the data lines and is electrically connected with the common signal line through the anti-static ring. A repair portion is arranged between the first line segment and the second line segment, the repair portion being used for enabling the first line segment to be electrically connected with the second line segment after being welded.

In this embodiment, by dividing the annular repair line into a first line segment that intersects with and is insulated from the data lines and a second line segment that does not intersects with the data lines, and arranging the repair portion between the first line segment and the second line segment insulated from each other, when the data line needs to be repaired with the repair line, the connectivity of the whole repair line can be achieved as long as the repair portion enables the first line segment to be electrically connected with the second line segment after being welded. In normal cases, because of the repair portion, the electrostatic charges aggregated on the common signal line when the array substrate is influenced by high temperature or high energy will not act on the data line via the first line segment, so that the electrostatic charges will not cause damage to the display panel, thereby increasing yield of the display panel.

In some embodiments, each of the repairing lines comprises two symmetrically distributed first line segments and two symmetrically distributed second line segments. The first line segments and the second line segments are arranged alternately to form the annular repair line, one repair portion is arranged between the first line segment and the second line segment that belong to the same repair line and are adjacent to each other. In this embodiment, by dividing the repair line into the second line segments and the first line segments, which are insulated from each other through the repair portion, the display panel will not be damaged, even if the electrostatic charges are transmitted to the second line segment. Meanwhile, the adjacent first line segments and second line segments can be combined flexibly so as to repair different data lines.

In some embodiments, the repair portions are arranged in regions close to four corners of the array substrate. In this embodiment, the repair portions are arranged at positions away from the effective display area of the array substrate, the repair portion will not influence the aperture ratio nor influence the display effect.

In some embodiments, the repair portion comprises a conductive electrode, the conductive electrode being insulated from the first line segment and the second line segment. A vertical projection of the conductive electrode respectively partially overlaps with vertical projections of end portions of the first line segment and the second line segment on the array substrate. In this embodiment, the end portions of the first line segment and the second line segment can connected with the conductive electrode at the vertical projection overlapping portion.

In some embodiments, the conductive electrode and the data lines are arranged in a same layer. By arranging the conductive electrode and the data line in the same layer, no additional manufacturing process and layer structure are required, thus the cost of the array substrate may be saved.

In some embodiments, the repair line and the gate lines of the array substrate are arranged in a same layer.

By dividing the annular repair line into a first line segment that intersects with and is insulated from the data lines and a second line segment that does not intersects with the data lines, and arranging the repair portion between first line segment and the second line segment insulated from each other, when the data line needs to be repaired with the repair line, the connectivity of the whole repair line may be achieved as long as the repair portion enables the first line segment to be electrically connected with the second line segment after being welded. In normal cases, the repair portion enables the electrostatic charges aggregated on the common signal line when the array substrate experiences high temperature or high energy not to act on the data line via the first line segment, so as to enable the electrostatic charges not to cause damage to the display panel, thereby increasing yield of the display panel.

An embodiment of the present invention further provides a display panel comprising the array substrate provided by any of the preceding embodiments.

An embodiment of the present invention further provides a display device comprising the display panel provided by the above embodiment.

An embodiment of the present invention further provides a method for manufacturing an array substrate, which may comprise the following steps:

forming a gate metal layer comprising a gate line, an annular common signal line and an annular repair line on a substrate, the repair line comprising a first line segment and a second line segment insulated from each other, forming a gate insulating layer and an active layer successively on the substrate, and forming a source-drain metal layer comprising a conductive electrode, a data line, a source and a drain on the substrate. The data lines and the gate lines are surrounded by the common signal line, each of the data lines intersects with and is insulated from the first line segment of the repair line, the data lines do not intersect with the second line segment of the repair line. A vertical projection of the conductive electrode respectively partially overlaps with vertical projections of end portions of the first line segment and the second line segment on the array substrate, and the conductive electrode acts as a repair portion and is used for enabling the first line segment to be electrically connected with the second line segment after being welded.

In some embodiments, the manufacturing method further comprises the steps of forming a passivation layer comprising a via hole on the substrate, and forming a transparent conductive layer comprising a pixel electrode above the passivation layer, so as to enable the pixel electrode to be electrically connected with the drain through the via hole.

By dividing the annular repair line into a first line segment that intersects with and is insulated from the data lines and a second line segment that does not intersects with the data lines, and arranging the repair portion between first line segment and the second line segment insulated from each other, when the data line needs to be repaired with the repair line, the connectivity of the whole repair line can be achieved as long as the repair portion enables the first line segment to be electrically connected with the second line segment after being welded. However, in normal cases, the repair portion enables the electrostatic charges aggregated on the common signal line when the array substrate is influenced by high temperature or high energy not to act on the data line via the first line segment, so as to enable the electrostatic charges not to cause damage to the display panel, thereby increasing yield of the display panel.

DETAILED DESCRIPTION OF THE INVENTION

Next, embodiments of the invention will be illustrated in detail with reference to the drawings. It should be noted that, throughout the specification, the same or similar reference sign represents the same or similar element or elements with the same or similar function. The embodiments described below by making reference to the drawings are exemplary, which are only used for explaining the invention and cannot be construed as limitations to the invention.

Figure 1:
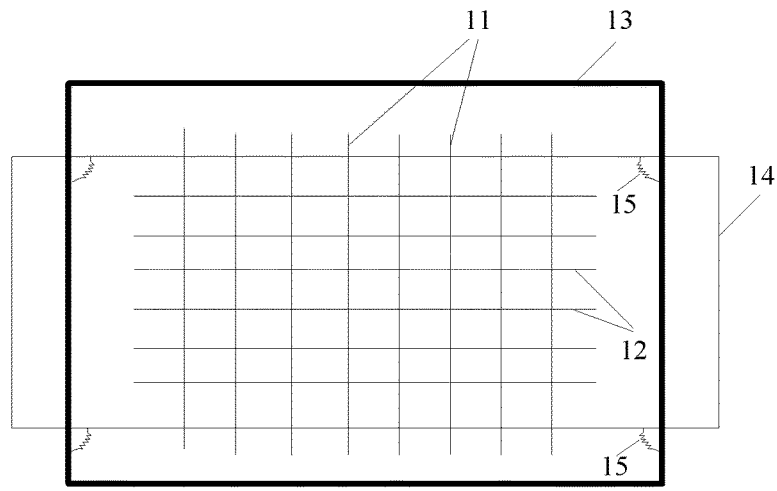
FIG. 1 is a schematic view of an array substrate provided by the prior art.
Figure 2:
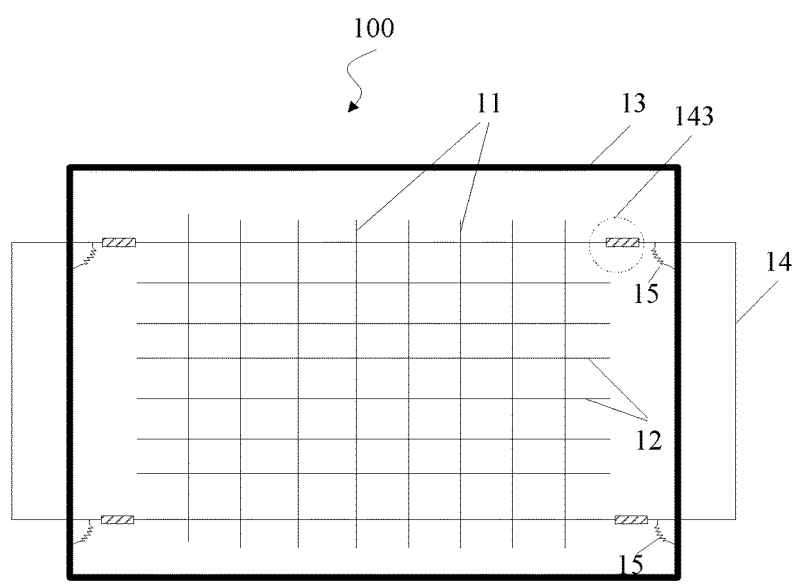
FIG. 2 is a schematic view of an array substrate provided by an embodiment of the present invention.

Referring to FIG. 2, an embodiment of the invention provides an array substrate 100, which comprises a plurality of data lines 11 and a plurality of gate lines 12 arranged to intersect with each other, an annular common signal line 13 surrounding the data lines 11 and the gate lines 12, and at least one annular repair line 14, the repair line 14 being electrically connected with the common signal line 13 through an anti-static ring 15. In this context of the application, the "anti-static ring" mentioned refers to an element for releasing electrostatic charges to protect the array substrate, which is not always in a ring shape. For example, as shown in FIG. 2, the anti-static ring 15 enables the common signal line 13 to be electrically connected with the repair line 14, thereby being capable of guiding the electrostatic charges on the repair line 14 to the common signal line, the anti-static ring 15 may have any appropriate shapes.

Figure 3:
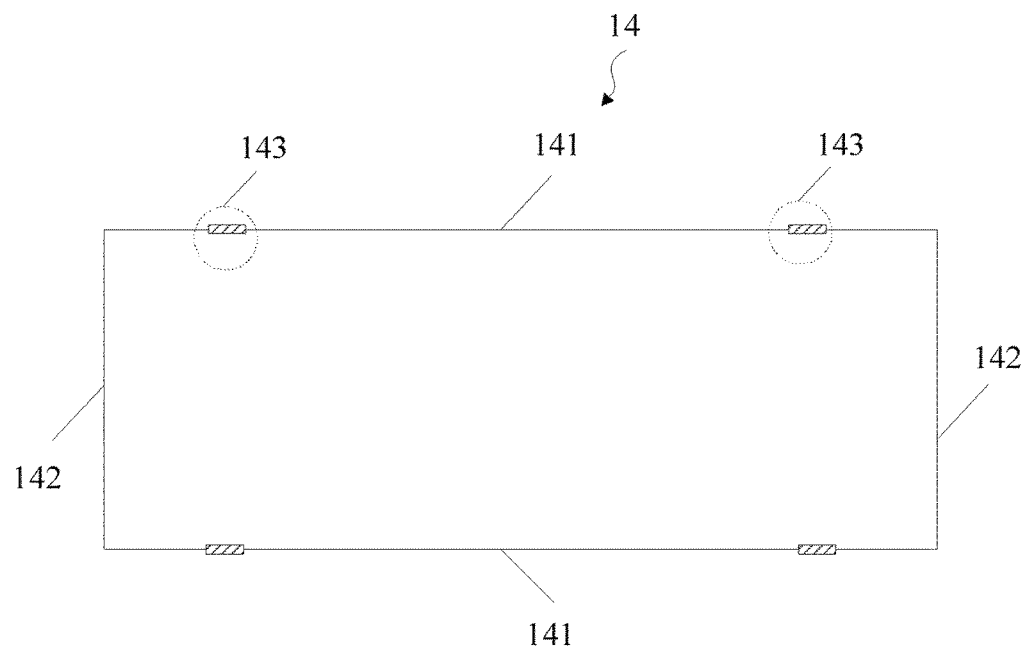
FIG. 3 is a schematic view of a repair line provided by an embodiment of the present invention.

As shown in FIGS. 2 and 3, the repair line 14 comprises a first line segment 141 and a second line segment 142 insulated from each other, the first line segment 141 intersects with and is insulated from each of the data lines 11. The second line segment 142 does not intersect with the data lines 11 and is electrically connected with the common signal line 13 through the anti-static ring 15. A repair portion 143 is arranged between the first line segment 141 and the second line segment 142, the repair portion 143 being used for enabling the first line segment 141 to be electrically connected with the second line segment 142 after being welded. In the embodiments of the invention, the common signal line 13 can be either a signal line for providing a common voltage or a signal line connected to the ground.

In this embodiment, the annular repair line 14 is divided into the first line segment 141 that intersects with and is insulated form the data lines 11 and the second line segment 142 that does not intersects with the data lines 11 and is insulated from the first line segment 141, a repair portion 143 is arranged between the first line segment 141 and the second line segment 142 insulated from each other, hence, when the data line 11 needs to be repaired with the repair line 14, connectivity of the whole repair line 14 may be achieved as long as the repair portion 143 enables the first line segment 141 to be electrically connected with the second line segment 142 after being welded. However, in normal cases, because of the repair portion 143, the electrostatic charges aggregated on the common signal line 13 when the array substrate 100 is influenced by high temperature or high energy will not act on the data line 11 via the first line segment 141, so that the electrostatic charges will not cause damage to the display panel, thereby increasing yield of the display panel.

In some embodiments, each repair line 14 comprises two symmetrically distributed first line segments 141 and two symmetrically distributed second line segments 142. The first line segments 141 and the second line segments 142 are arranged alternately to form the annular repair line 14, one repair portion 143 is arranged between the first line segment 141 and the second line segment 142 that belong to the same repair line 14 and are adjacent to each other. In this embodiment, by dividing the repair line 14 into the second line segments 142 and the first line segments 141, which are insulated from each other through the repair portion 143, the display panel will not be damaged, even if the electrostatic charges are transmitted to the second line segment 142. Meanwhile, the adjacent first line segments 141 and second line segments 142 can be combined flexibly so as to repair different data lines 11.

In some embodiments, the repair portions 143 are arranged in regions close to four corners of the array substrate 100. In this embodiment, the repair portions 143 are arranged at positions away from the effective display area of the array substrate 100, the repair portion 143 will not influence the aperture ratio nor influence the display effect.

The repair portion 143 may be either manufactured separately or implemented by means of certain conductive layers of the array substrate 100. The repair portion 143 has to be insulated from the first line segment 141 and the second line segment 142, and can be welded when the first line segment 141 and the second line segment 142 are required to be connected to each other, so as to achieve the connectivity of the first line segment 141 and the second line segment 142.

Figure 4:
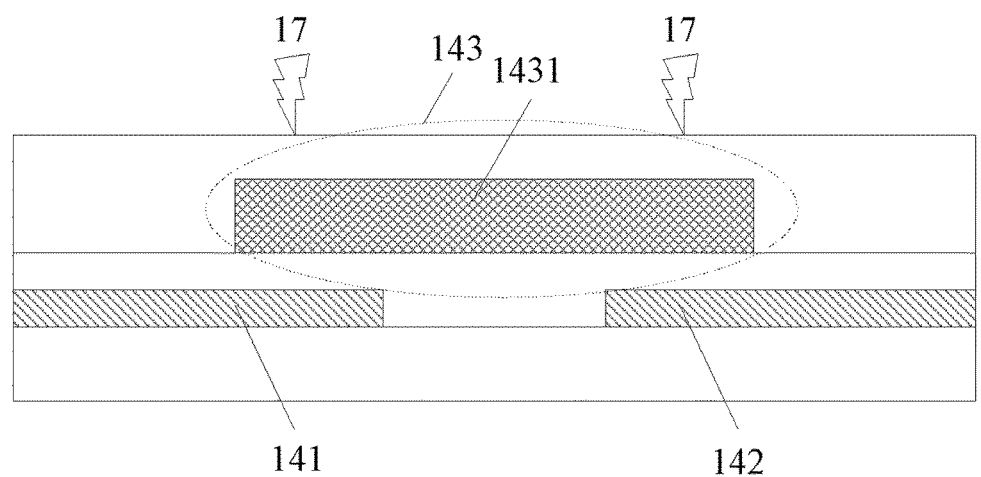
FIG. 4 is a schematic sectional view of a repair portion provided by an embodiment of the present invention.

Referring to FIG. 4, which shows a sectional view of a repair portion 143 according to an embodiment of the present invention. The repair portion 143 comprises a conductive electrode 1431, the conductive electrode 1431 being insulated from the first line segment 141 and the second line segment 142. A vertical projection of the conductive electrode 1431 respectively partially overlaps with vertical projections of end portions of the first line segment 141 and the second line segment 142 on the array substrate 100. The layer structure between the conductive electrode 1431 and the first line segment 141 and the second line segment 142 is an insulating layer, which will not be described in detailed here. When welding is required, it can be performed at a position 17 as shown in FIG. 4, so that the conductive electrode 1431 of the repair portion 143 is connected with the first line segment 141 and the second line segment 142 respectively. In this embodiment, the end portions of the first line segment 141 and the second line segment 142 can be connected with the conductive electrode 1431 at the vertical projection overlapping portion.

In some embodiments, the conductive electrode 1431 and the data lines 11 are arranged in a same layer. In this embodiment, by arranging the conductive electrode 1431 and the data lines 11 in the same layer, no additional manufacturing process and layer structure are required, thus the cost may be saved.

In some embodiments, the repair line 14 and the gate lines 12 of the array substrate 100 are arranged in a same layer.

Figure 5:
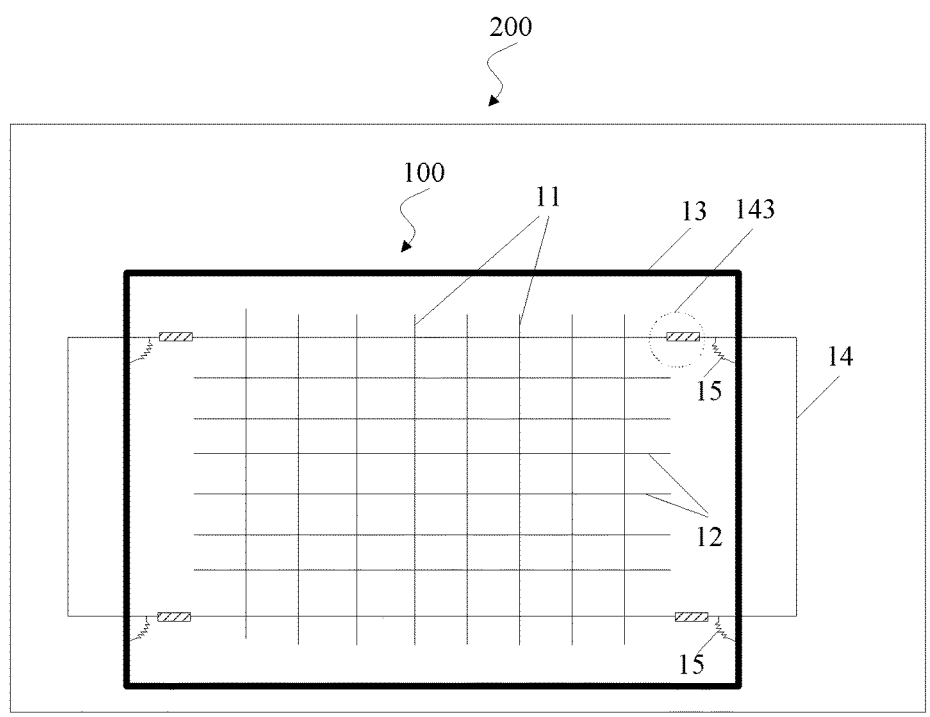
FIG. 5 is a schematic view of a display panel provided by an embodiment of the present invention.

Referring to FIG. 5, an embodiment of the invention further provides a display panel 200, comprising an array substrate 100 provided by any of the above embodiments.

An embodiment of the present invention further provides a display device, comprising a display panel 200 provided by the above embodiment, which will not be illustrated herein.

By dividing the annular repair line 14 into a first line segment 141 that intersects with and is insulated from the data lines 11 and a second line segment 142 that does not intersects with the data lines 11, and arranging the repair portion 143 between the first line segment 141 and the second line segment 142 insulated from each other, when the data line 11 needs to be repaired with the repair line 14, the connectivity of the whole repair line 14 can be achieved as long as the repair portion 143 enables the first line segment 141 to be electrically connected with the second line segment 142 after being welded. While in normal cases, because of the repair portion 143, the electrostatic charges aggregated on the common signal line 13 when the array substrate 100 is influenced by high temperature or high energy will not act on the data line 11 via the first line segment 141, so that the electrostatic charges will not cause damage to the display panel, thereby increasing yield of the display panel.

Figure 6:
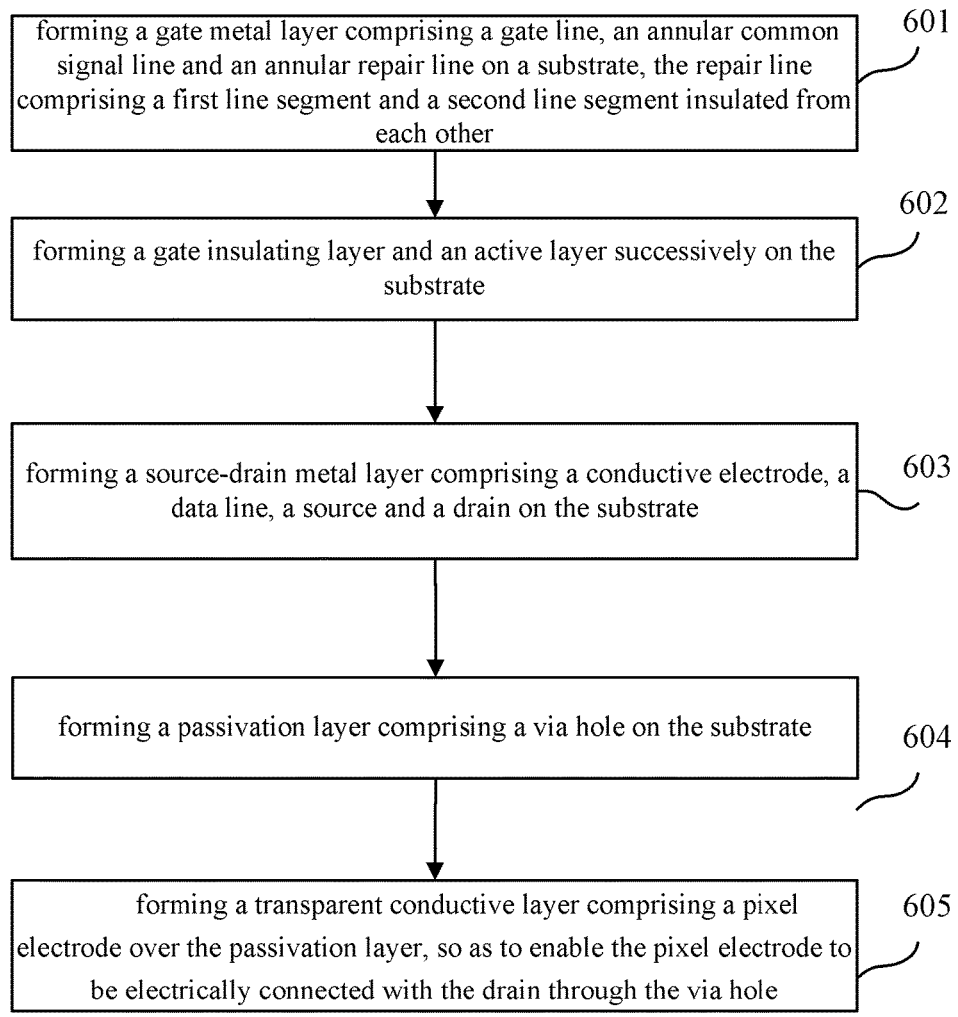
FIG. 6 is a flow chart of a method for manufacturing an array substrate provided by an embodiment of the present invention.

Referring to FIG. 6, an embodiment of the invention further provides a method for manufacturing an array substrate, comprising:

601. forming a gate metal layer comprising a gate line, an annular common signal line and an annular repair line on a substrate, the repair line comprising a first line segment and a second line segment insulated from each other.

602. forming a gate insulating layer and an active layer successively on the substrate where the above step 601 has been performed.

603. forming a source-drain metal layer comprising a conductive electrode, a data line, a source and a drain on the substrate wherein the above step 602 has been performed. The data lines and the gate lines are surrounded by the common signal line, each of the data lines intersects with and is insulated from the first line segment of the repair line, the data lines do not intersect with the second line segment of the repair line. A vertical projection of the conductive electrode respectively partially overlaps with vertical projections of end portions of the first line segment and the second line segment on the array substrate, the conductive electrode acts as a repair portion and is used for enabling the first line segment to be electrically connected with the second line segment after being welded.

604. forming a passivation layer comprising a via hole on the substrate where the above step 603 has been performed.

605. forming a transparent conductive layer comprising a pixel electrode over the passivation layer, so as to enable the pixel electrode to be electrically connected with the drain through the via hole.

For the method for manufacturing an array substrate provided by the embodiment of the invention, the annular repair line is divided into a first line segment that intersects with and is insulated from the data lines and a second line segment that does not intersect with the data lines. The conductive electrode and the insulating portion between the first line segment and the second line segment insulated from each other can be referred to as a repair portion. When the data line needs to be repaired with the repair line, the connectivity of the whole repair line can be achieved as long as the repair portion enables the first line segment to be electrically connected with the second line segment after being welded. While in normal cases, because of the repair portion, the electrostatic charges aggregated on the common signal line when the array substrate is influenced by high temperature or high energy will not act on the data line via the first line segment, so that the electrostatic charges will not cause damage to the display panel, thereby increasing yield of the display panel.

Apparently, a person having an ordinary skill in the art can make various modifications and variations to the embodiments of the invention without departing from the spirit and the scope of the invention. In this way, provided that these modifications and variations to the embodiments belong to the scope of the claims of the application and the equivalent technologies thereof, the present invention also intends to encompass these modifications and variations.

The invention claimed is:

1. An array substrate comprising:
   a plurality of data lines and a plurality of gate lines arranged to intersect with each other;
   an annular common signal line surrounding the data lines and the gate lines; and
   at least one annular repair line, the repair line being electrically connected with the common signal line through an anti-static ring,
   wherein the repair line comprises a first line segment and a second line segment insulated from each other,
   wherein the first line segment intersects with and is insulated from each of the data lines, the second line segment does not intersect with the data lines and is electrically connected with the common signal line through the anti-static ring, and
   wherein a repair portion is arranged between the first line segment and the second line segment, the repair portion being used for enabling the first line segment to be electrically connected with the second line segment after being welded.

2. The array substrate as claimed in claim 1, wherein each of the repair lines comprises two symmetrically distributed first line segments and two symmetrically distributed second line segments,
   the first line segments and the second line segments are arranged alternately to form the annular repair line, one of the repair portions is arranged between the first line segment and the second line segment that belong to the same repair line and are adjacent to each other.

3. The array substrate as claimed in claim 2, wherein the repair portions are arranged in regions close to four corners of the array substrate.

4. The array substrate as claimed in claim 2, wherein the repair portion comprises a conductive electrode, the conductive electrode being insulated from the first line segment and the second line segment,
   wherein a vertical projection of the conductive electrode respectively partially overlaps with vertical projections of end portions of the first line segment and the second line segment on the array substrate.

5. The array substrate as claimed in claim 4, wherein the conductive electrode and the data lines are arranged in a same layer.

6. The array substrate as claimed in claim 1, wherein the repair line and the gate lines of the array substrate are arranged in a same layer.

7. A display panel comprising an array substrate, the array substrate comprising:
   a plurality of data lines and a plurality of gate lines arranged to intersect with each other;
   an annular common signal line surrounding the data lines and the gate lines; and
   at least one annular repair line, the repair line being electrically connected with the common signal line through an anti-static ring,
   wherein the repair line comprises a first line segment and a second line segment insulated from each other,
   wherein the first line segment intersects with and is insulated from each of the data lines, the second line segment does not intersect with the data lines and is electrically connected with the common signal line through the anti-static ring,
   wherein a repair portion is arranged between the first line segment and the second line segment, the repair portion being used for enabling the first line segment to be electrically connected with the second line segment after being welded.

8. The array substrate as claimed in claim 7, wherein each of the repair lines comprises two symmetrically distributed first line segments and two symmetrically distributed second line segments,
   the first line segments and the second line segments are arranged alternately to form the annular repair line, one of the repair portions is arranged between the first line segment and the second line segment that belong to the same repair line and are adjacent to each other.

9. The array substrate as claimed in claim 8, wherein the repair portions are arranged in regions close to four corners of the array substrate.

10. The array substrate as claimed in claim 8, wherein the repair portion comprises a conductive electrode, the conductive electrode being insulated from the first line segment and the second line segment,
    wherein a vertical projection of the conductive electrode respectively partially overlaps with vertical projections of end portions of the first line segment and the second line segment on the array substrate.

11. The array substrate as claimed in claim 10, wherein the conductive electrode and the data lines are arranged in a same layer.

12. The array substrate as claimed in claim 7, wherein the repair line and the gate lines of the array substrate are arranged in a same layer.

13. A method for manufacturing an array substrate, comprising:
    forming a gate metal layer comprising a gate line, an annular common signal line and an annular repair line on a substrate, the repair line comprising a first line segment and a second line segment insulated from each other;

forming a gate insulating layer and an active layer successively on the substrate;

forming a source-drain metal layer comprising a conductive electrode, a data line, a source and a drain on the substrate, wherein the data lines and the gate lines are surrounded by the common signal line, each of the data lines intersects with and is insulated from the first line segment of the repair line, the data lines do not intersect with the second line segment of the repair line, wherein a vertical projection of the conductive electrode respectively partially overlaps with vertical projections of end portions of the first line segment and the second line segment on the array substrate, and wherein the conductive electrode acts as a repair portion and is used for enabling the first line segment to be electrically connected with the second line segment after being welded.

14. The manufacturing method as claimed in claim 13, further comprising:

forming a passivation layer comprising a via hole on the substrate;

forming a transparent conductive layer comprising a pixel electrode over the passivation layer, so as to enable the pixel electrode to be electrically connected with the drain through the via hole.

\* \* \* \* \*